US006914184B1

(12) United States Patent
Lahita

(10) Patent No.: US 6,914,184 B1
(45) Date of Patent: Jul. 5, 2005

(54) RADIATION RESISTANT DOOR SEAL

(76) Inventor: Michael John Lahita, 310 N. Main St., Owasso, OK (US) 74055

( * ) Notice: Subject to any disclaimer, the term of this patent is extended or adjusted under 35 U.S.C. 154(b) by 0 days.

(21) Appl. No.: 10/827,019

(22) Filed: Apr. 19, 2004

(51) Int. Cl.$^7$ ................................................. H05K 9/00
(52) U.S. Cl. ................................ 174/35 GC; 361/816; 49/483.1
(58) Field of Search ........................ 174/35 GC, 35 R, 174/35 MS; 277/920; 361/816, 818; 49/475.1, 483.1

(56) References Cited

U.S. PATENT DOCUMENTS

| | | | |
|---|---|---|---|
| 3,589,070 A | * | 6/1971 | Hansen ........................ 49/483.1 |
| 4,069,618 A | * | 1/1978 | Geiss ........................... 49/483.1 |
| 4,370,831 A | | 2/1983 | Hamilton |
| 4,561,209 A | | 12/1985 | Sohlstrom |
| 4,656,312 A | | 4/1987 | Mallott et al. |
| 4,677,251 A | * | 6/1987 | Merewether ........... 174/35 MS |
| 4,691,483 A | | 9/1987 | Anderson |
| 4,705,916 A | | 11/1987 | Wadhera et al. |
| 4,724,635 A | | 2/1988 | Side et al. |
| 4,746,765 A | | 5/1988 | Mallott |
| 4,760,214 A | | 7/1988 | Bienia et al. |
| 4,786,758 A | | 11/1988 | Zielinski |
| D300,097 S | | 3/1989 | Cook |
| 4,817,337 A | * | 4/1989 | Lahita ........................ 49/483.1 |
| 4,841,692 A | | 6/1989 | Coupard et al. |
| 4,910,920 A | | 3/1990 | Nichols |
| 4,929,802 A | * | 5/1990 | Schaepers et al. ...... 174/35 MS |
| 4,953,324 A | | 9/1990 | Herrmann |
| 5,017,736 A | | 5/1991 | Yarger et al. |
| 5,045,636 A | | 9/1991 | Johnasen et al. |
| 5,223,670 A | | 6/1993 | Hogan et al. |
| 5,569,878 A | | 10/1996 | Zielinski |
| 5,786,547 A | | 7/1998 | Zielinski |
| 6,323,419 B1 | * | 11/2001 | Toy ........................... 174/35 GC |

* cited by examiner

Primary Examiner—Dean A. Reichard
Assistant Examiner—Carmelo Oliva
(74) Attorney, Agent, or Firm—Winstead Sechrest & Minick P.C.; Sanford E. Warren, Jr.

(57) ABSTRACT

An improved radiation resistant door seal which is comprised of a door member and frame member. The door member comprises a plurality of flange members and a conductive blade which extends lengthwise and is insertable within a channel formed within the frame member. The channel within the frame member further comprises side walls with bowed contact members on each side of the walls to engagingly capture the blade when inserted therein. A plurality of finger-like contact members is positioned within the door member such to provide enhanced shielding and electrical contact areas to thwart radiation penetration.

14 Claims, 3 Drawing Sheets

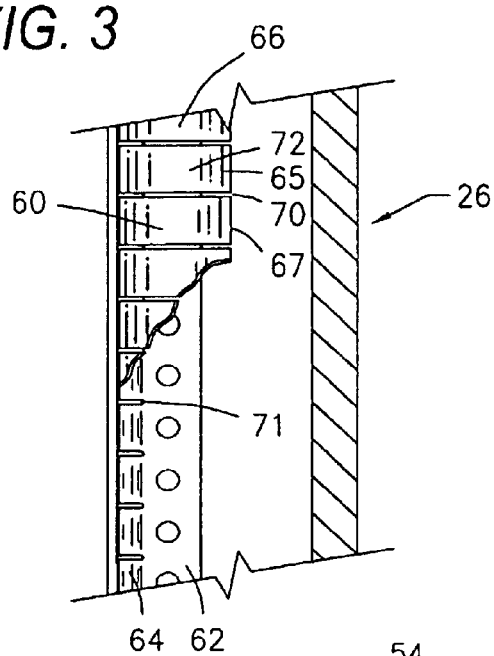
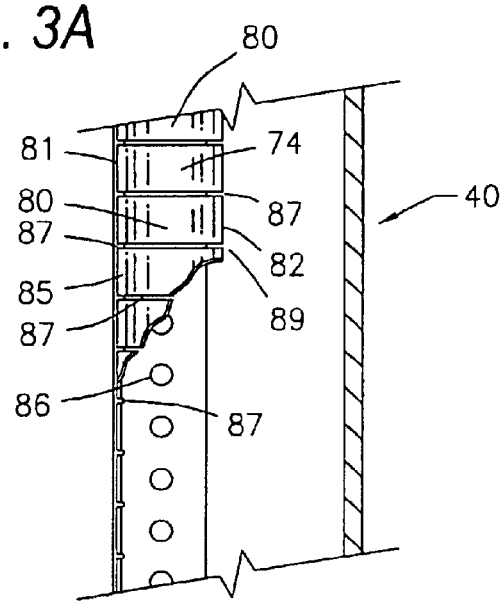
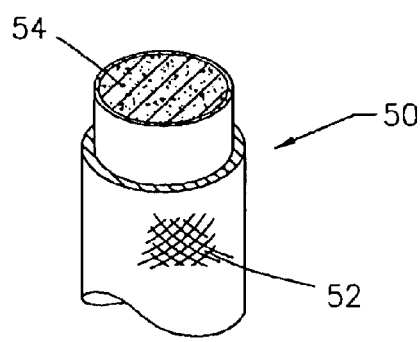
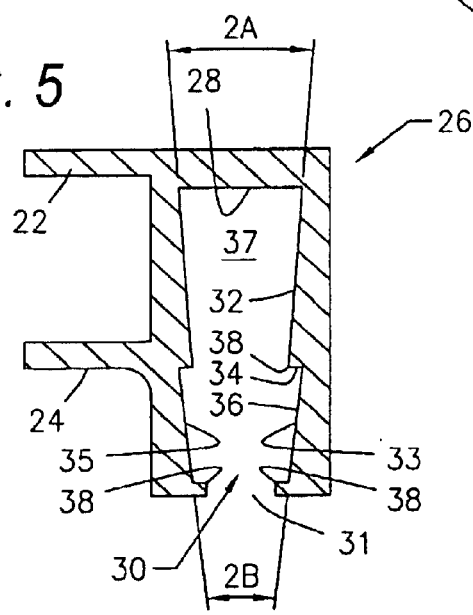
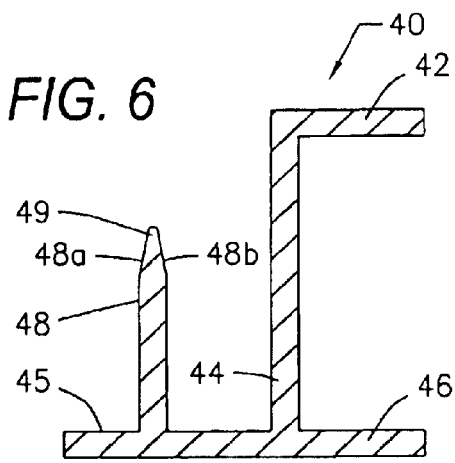

US 6,914,184 B1

RADIATION RESISTANT DOOR SEAL

REFERENCE TO PENDING APPLICATIONS

This application is not related to any pending applications.

REFERENCE TO MICROFICHE APPENDIX

This application is not referenced in any microfiche appendix.

BACKGROUND OF THE INVENTION

This invention relates to the construction of radiation shielded enclosures of the type designed to have an interior that may be relatively isolated from radio interference and other radiation. The invention is particularly directed to the construction of door joints for such enclosures for the purpose of increasing the resistance to radiation penetration through the joints between the edges of the door and its frame.

U.S. Pat. No. 4,817,337 (hereinafter referred to as the '337 patent) issued on Apr. 4, 1989 to Lahita shows a radiation resistant door seal. It is to be noted that the Lahita of the '337 patent is the inventor of the present invention. The present application advances the art beyond that disclosed in the '337 patent by teaching, disclosing and claiming resilient arch shaped contact members absent the bowed forward section and edge sections associated with the resilient contact members required of the '337 patent. Further, the instant invention provides, discloses and claims a third arch-like member attached to a door section which in combination provides for additional electrical contact areas to that offered in the '337 patent as well as obviating a deficiency in the '337 patent which requires contact members to compress or otherwise displace in a direction in opposition to shielding pressure induced by a door blade when inserting a rigid blade member between the contact members. Succinctly stated, the enhancements to the art taught by the instant application advance the teachings of the '337 patent by providing additional shielding and electrical contact surfaces.

Shielding effectiveness requirements are ever increasing such that standards that were acceptable in the past may be totally unacceptable today. For example, the door joint must be as resistant to radiation leakage as the enclosure itself.

A door and frame construction herein disclosed provides 360 degree environmental protection against air, sound and dust and radiation (non-ionizing) protection about the periphery of the door. Tapering of channel side walls to complement the different contact sections increases surface contact, reduces friction, and improves radiation shielding via the metal-to-metal contacting between contact spring fingers. A knife-edge shoulder in each opposed channel side wall increases contact with its contact plate, forms and cooperates to hold its contact plate in the channel. Further, tapered side walls reduce friction forces resisting door closure and increase conductive paths by affording a larger contacting surface of the contact plates with the blade.

Consequently, it is an object of the instant invention to provide a door and frame construction which provides 360 degrees of environmental protection against air, sound, dust and radiation protection around the periphery of the door.

It is a further object of the instant invention to provide, teach and claim the tapered channel walls to compliment different contact sections which reduce friction and improve radiation shielding by a metal-to-metal contacting between spring fingers.

Another object of the instant invention is to provide, teach and claim a knife-edge shoulder in each opposed channel on the frame member which biases contact members rearwardly when blade-like structure is inserted between contact members and thereby further easing/orienting; door closing sealing.

Yet it is another object of the instant invention to teach an improved radiation resistant door seal which provides tapered sidewalls to reduce friction, forces resistant door closure and increase conductive paths by affording a larger contacting surface of contact plates with an insertion blade.

An additional object of the instant invention is to teach and claim an improved radiation resistant door seal which facilitates contact member directional compression in a direction of that taught by the '357 patent.

Other objects and further scope of the applicability of the present invention will become apparent from the detailed description to follow, taken in conjunction with the accompanying drawings wherein like parts are designated by like reference numerals.

BRIEF SUMMARY OF THE INVENTION

A radiation resistant enclosure comprising a door member hingedly fixed to a frame member having a doorway adjacent edge portions of the members being electrically conductive, one member including a conductive channel extending lengthwise and having a back wall and a pair of side walls and the other member including an arched contact plate, a plurality of flange members and a conductive blade extending lengthwise and insertable within said channel, and a pair of elongated metal plates for engaging one respective side wall in said channel and the blade to establish good electrical contact therebetween, characterized in that said side walls incline inwardly towards one another whereby to describe a truncated edge-shaped cross-section including an interior shoulder and an elongated interior chamber adjacent the back wall, and each plate has opposite edges with a planar portion engaging the side wall of said chamber and the shoulder, a bowed forward section extending from the planar portion engaging the side wall adjacent to the opening to said channel, and a bowed rearward section extending from the other edge and a bowed central section connecting said sections and adapted to engage the blade.

DESCRIPTION OF THE DRAWINGS

FIG. 3 is a vertical section taken on line 3—3 of FIG. 2.

FIG. 3A is a vertical section taken on line 3A—3A of FIG. 2.

FIG. 4 is a view partially in section of a polymer gasket enclosed in a conductive mesh and in a relaxed state.

FIG. 5 is a section view of the conductive edge of the frame.

FIG. 6 is a section view of the conductive edge of the door showing a flange for compressing a conductive gasket against the frame.

DETAILED DESCRIPTION OF THE PREFERRED EMBODIMENT

While the making and using of various embodiments of the present invention are discussed in detail below, it should be appreciated that the present invention provides for inventive concepts capable of being embodied in a variety of specific contexts. The specific embodiments discussed herein are merely illustrative of specific manners in which to make and use the invention and are not to be interpreted as limiting the scope of the instant invention.

The claims and the specification describe the invention presented and the terms that are employed in the claims draw their meaning from the use of such terms in the specification. The same terms employed in the prior art may be broader in meaning than specifically employed herein. Whenever there is a question between the broader definition of such terms used in the prior art and the more specific use of the terms herein, the more specific meaning is meant.

While the invention has been described with a certain degree of particularity, it is clean that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

Figure 1:
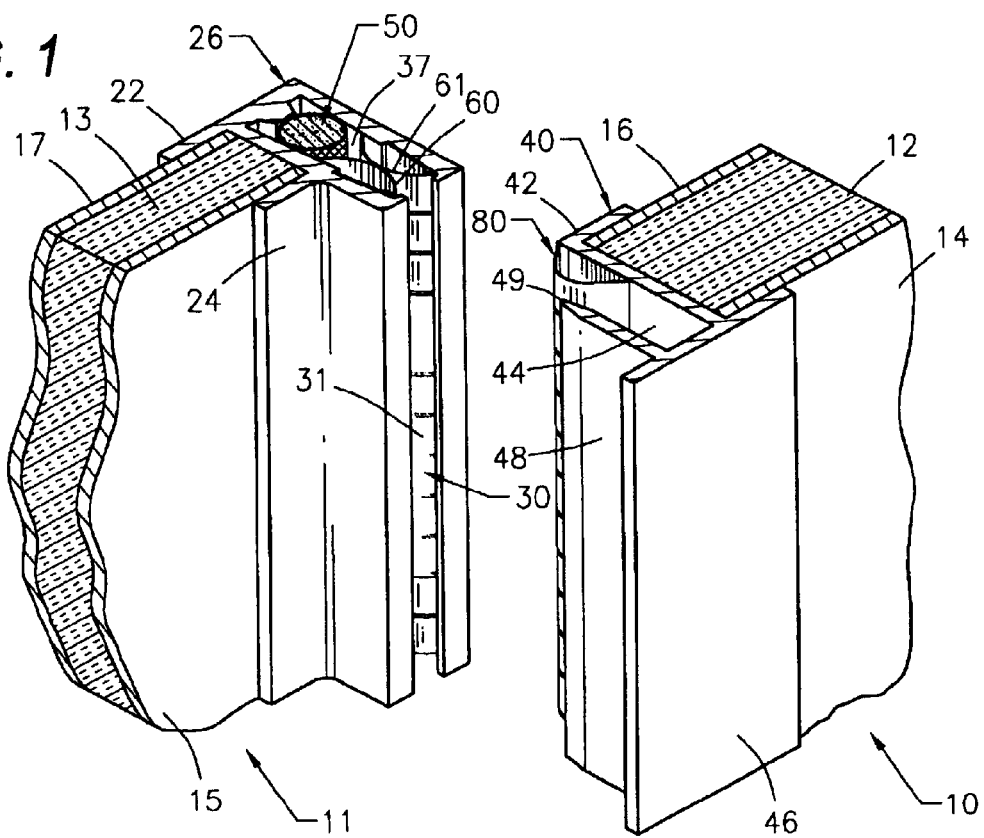
FIG. 1 is an isometric view of a portion of a door for a radiation resistant structure and a portion of the frame of the enclosure against which the front edge of the door closes, the door being shown in a slightly open position.
Figure 2:
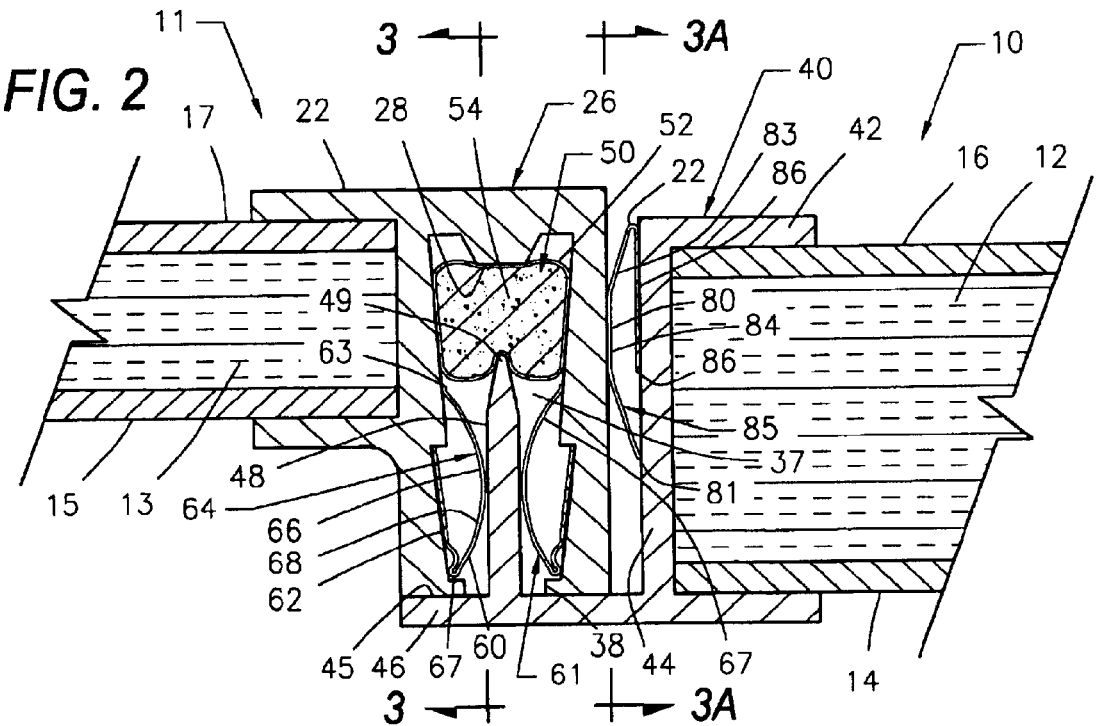
FIG. 2 is a horizontal section of the two edge portions of the door and frame with the door in fully closed position.

Turning now to the drawings a door 10 is arranged to swing about hinges (not shown) located at the right of the portion of the door illustrated in FIG. 1. This door cooperates with a frame 11 which may be a portion of the wall of a radiation-proof enclosure to which the door is mounted. As shown in FIGS. 1 and 2 both door 10 and frame or wall 11 may be composed of wood laminations 12 and 13 respectively and these are sheathed on their opposite sides or faces by metallic sheets 14, 16 and 15, 17. A conductive joint member 26 is mounted on the edge of door frame 11 and a cooperative conductive joint member 40 is mounted on the corresponding edge of door 10.

Joint member 26 has a pair of flanges 22, 24 which are mounted in fixed relation to door frame 11 and has a vertical channel 30 formed by side walls 33 and 35 which project forwardly from the bottom of the channel or back wall 28. A mouth or opening 31 of channel 30 facing the outside of the enclosure is disposed to the left of door 10 as shown in FIG. 1.

A pair of arch formed resilient contact members 60, 61 are disposed in the channel in a manner forcing compression of said members to displace towards sidewalls 33 and 35 and rear wall 28. Said displacement providing for insertion ease beyond that afforded by the '337 patent which failed to allow for rearward compression (directional) response and counter productively enforced a directional response to compression towards channel opening 31. Each contact is made from beryllium copper and comprises an elongated comb-like strip of metal of generally uniform cross-section including opposite generally parallel edges 63, 67, one edge 63 rearwardly engaging sidewall 35 and the other edge 67 engaging sidewall 35 adjacent opening 31 of the channel, a flat planar portion 62 extending from edge 67, a bowed rearward section 64, a bowed central section 66, and a bowed forward section 68 adjacent the edge 67. A plurality of slots 70 extend inwardly from edge 67 to their terminus 71 in planar portion 62 defining a plurality of laterally separated fingers 72.

Cooperating joint member 40 of the radiation resistant joint is secured to door 10 and includes flanges, 42, 44, 46 and a rigid blade member 48 extending perpendicularly from flange 46. A plurality of arched contact plates represented as literally separated fingers are attached to flange 44 by planar section 86. The blade member 48 is adapted to enter into the channel 30 and has slightly tapered leading edges 48a, 48b to enhance entry into the channel when engaging the opposed resilient contact members 60, 61 and an end 49 for engaging a deformable conductive gasket 50 abutting the back wall 28 of the channel 30.

The flange 46 has an inner face 45 adapted to confront the frame 11 and extend laterally beyond (i.e. overlap) the outer peripheral edges of the doorway in a covering relation about the channel opening 31.

Further shown in association with the drawings, most particularly FIGS. 1, 2, and 3A is a contact member 80 having a forward edge 81 and rear edge 82. Said contact member 80 further comprises a bowed rear section 83, bowed central section 84 and a bowed forward section 85. A planar portion 86 and a plurality of slots 87 which extend inwardly from rear edge 82 to then terminus 89 defining a plurality of laterally separated fingers 90.

The deformable conductive gasket 50 mounted in the channel 30 against the back wall 28 functions to reduce acoustic levels and provide electrical contact between the contact members 60 61, the back wall 28 and the blade 48. Gasket 50 is elongated, generally cylindrical and comprised of a deformable polymer 54 enclosed by a conductive metal mesh 52 which preferably comprises coated copper clad steel, tin plated phosphor bronze, silver plated brass, MONEL (an alloy) or aluminum.

The side walls 33, 35 and back wall 28 of the channel 30 describe a lengthwise extending truncated edge shaped cross-section including chamber 37 adjacent to the back wall 28. Each side wall includes an end wall 34 defining a shoulder 38 and first and second side wall portions 32 36, the first side wall portion 32 defining part of the chamber 37 and extending outwardly from the back wall 28 of the channel 30 and to the wall 34, and the second side wall portion 36 extending inwardly from the mouth or opening 31 leading into the channel 30 and to the shoulder 38. The end walls 34 face the back wall and extend between the first and second side wall portions whereby to cause a the second side wall portions 36 to be laterally offset from and superposing the first side wall portions 32. The end walls 34, the first side wall portions 32, and the back wall 28 define the elongated chamber 37. To advantageously cooperate with the contact members 60, 61, the side walls are inclined away from one another at an acute angle relative to a perpendicular drawn from the back wall 28. As shown, the two wide walls 33, 35 are symmetrically disposed to the perpendicular and the first side wall portions 32 define a double included angle "2A" of between 10 and 50 degrees. In one construction an acute angle "A" of about 16 degrees was found suitable. It is to be understood that each second side wall portion 36 could be the same as or at a different angle than its first side wall portion 32.

The contact members 60, 61 are positioned in the channel 30 such that the rearward edge 63 of each contact conductively engages the gasket 50 and each contact conductively engages its respective side wall 33, 35 at three points, namely, the bowed rearward section 64 engages the first side wall portion 32, and the bowed forward section 68 engages the second side wall portion 36 and the shoulder or knife edge 38. Once inserted in the channel 30 the contact members 60, 61 are held in place by the ridge formed by 34, 38 whereupon the gasket 50 is inserted to engage end wall 28 and bowed rear sections 64 of contact members 60, 61. The shoulder 38 on each side wall defines a fulcrum such that when the blade 48 engages the bowed central section 66, the bowed forward and rearward section 64, 68 of each plate is biased against its side wall portion 32, 36. The knife edge 38 provides a high unit loading contact against the plates 60, 61 at 65 to ensure that electrical conductivity is not compromised by oxides or grit that may form on the metal.

The planar portions 62, while shown at an acute angle to a perpendicular drawn from back wall 28, are generally pressed against their inner second side wall portions 34, 35. Driving entry and positioning of the blade tip 49 against gasket 50 ensures that the planar portions 62 engage the side wall portions 32 and the edge 63 is driven against the wall 28. Advantageously four points of contact are achieved between each plate and the channel. Due to the slope of the second side wall portion 36 adjacent the channel opening 31 being complementary to the bowed forward section 68 of the contacts, frictional forces resisting opening or closing of the door are reduced without sacrifice in desired wiping of the side wall thereby assuring that a good electrical path is established between the joints.

Figure 7:
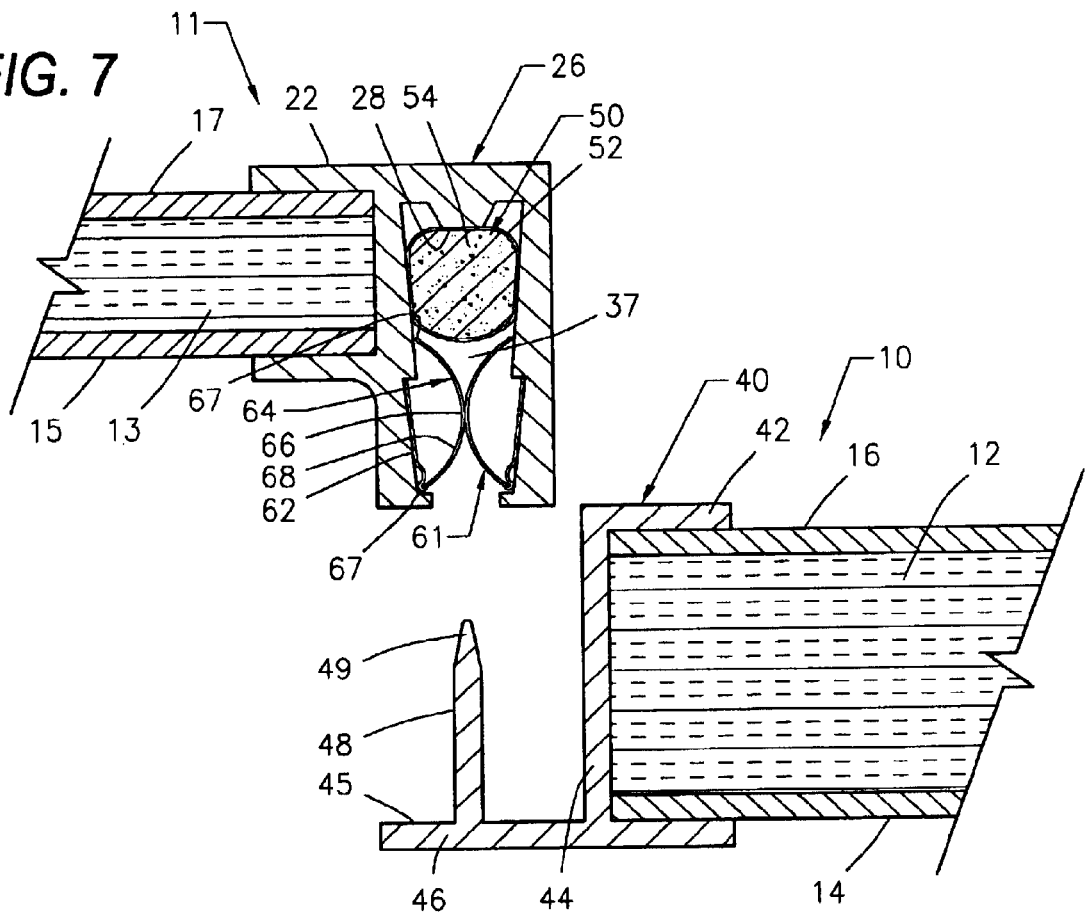
FIG. 7 is a section view of the door and frame showing an alternative embodiment of the invention in an open position.
Figure 7A:
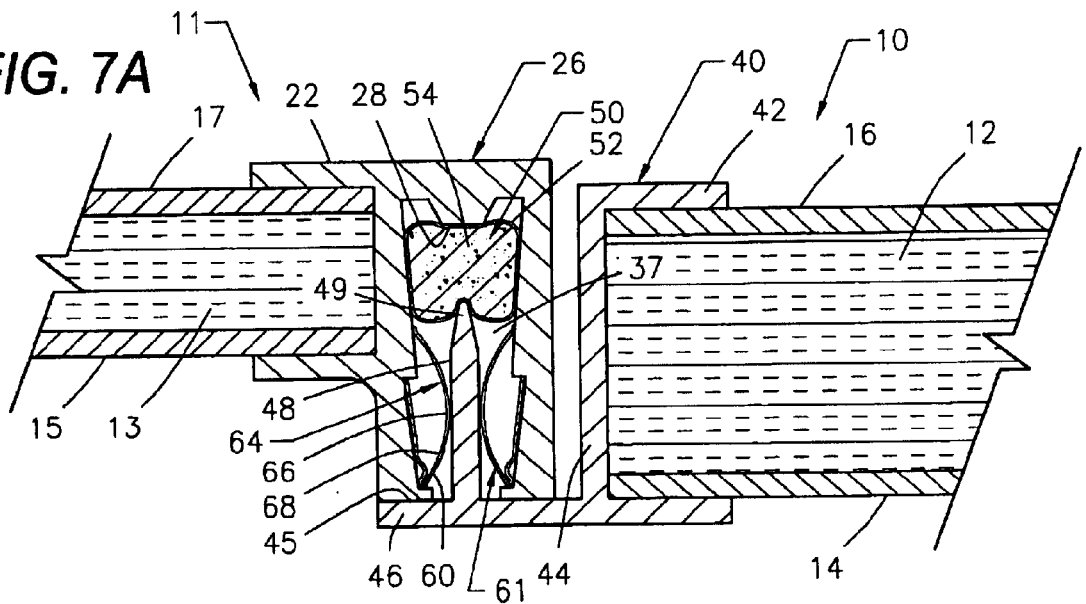
FIG. 7A is a section view of the door and frame showing an alternative embodiment of the invention in a closed position.

In a readily envisioned alternative embodiment, FIGS. 7 and 7A illustrate the door section 10 and frame section 11 illustrated absent the bowed contact member 80 which has been discussed and disclosed in detail in association with FIGS. 1 through 6.

It will of course be understood that various changes may be made in form, details, arrangement and proportions of the apparatus without departing from the scope of the invention, which generally stated consists of an apparatus capable of carrying out the objects above set forth, in the parts and combination of parts as disclosed and defined in the appended claims.

What is claimed is:

1. A radiation resistant enclosure comprising a door member hingedly fixed to a frame member having a doorway adjacent edge portions of the members being electrically conductive, one member including a conductive channel extending lengthwise and having a back wall and a pair of side walls and the other member including an arched contact plate, a plurality of flange members and a conductive blade extending lengthwise and insertable within said channel, and a pair of elongated metal plates for engaging one respective side wall in said channel and the blade to establish good electrical contact therebetween, characterized in that said side walls incline inwardly towards one another whereby to describe a truncated edge shaped cross-section including an interior shoulder and an elongated interior chamber adjacent the back wall, and each plate has opposite edges with a planar portion engaging side wall of said chamber and the shoulder, a bowed forward section extending from the planar portion engaging the side wall adjacent to the opening to said channel, and a bowed rearward section extending from the other edge and a bowed central section connecting said sections and adapted to engage the blade.

2. The radiation resistant enclosure as recited in claim 1 wherein each side wall includes an inner and an outer portion, the respective portions being parallel and laterally offset from one another by its shoulder and said inner portion extending between its shoulder and the back wall.

3. The radiation resistant enclosure as recited in claim 1 further characterized by conductive first shield means in said channel engaging the back wall and the planar portion of said plates for electromagnetically shielding the enclosure, said first shield means being engaged by the blade for conductively interconnecting the back wall and the metal plates with the blade when the door is closed.

4. The radiation resistant enclosure as recited in claim 3 wherein said first shield means comprises a metallic mesh surrounding a deformable body.

5. The radiation resistant enclosure as recited in claim 4 wherein each said planar portion is generally compressed into engagement with its respective side wall.

6. The radiation resistant enclosure as recited in claim 5 wherein the towed central sections engage one another when the blade is not in the channel and each shoulder engages its plate and functions as a fulcrum when the central section engages the blade to bias the forward sections of its plate against the chamber wall.

7. The radiation resistant enclosure as recited in claim 1 wherein said other member further comprises a plurality of laterally separated arched contact plate fingers. (Note: door contact plates)

8. The radiation resistant enclosure as recited in claim 1 wherein a plurality of laterally separated slots extend inwardly from the other edge of each said plate whereby to define a plurality of resilient fingers, each slot having an inward terminus adjacent to the one edge.

9. The radiation resistant enclosure as recited in claim 1 wherein said side walls describe a double included angle of between 10 and 50 degrees.

10. The radiation resistant enclosure as recited in claim 1 wherein each side wall is at an acute angle to a perpendicular drawn to the back wall, said acute angle being approximately 16 degrees.

11. The radiation resistant enclosure as recited in claim 1 wherein said channel forms a continuous 360 degree opening to receive a like extending blade.

12. The radiation resistant enclosure as recited in claim 1 characterized by conductive second shield means exterior of the channel for shielding 360 degrees around the door and the frame when the door is closed.

13. A doorway construction for a radio-frequency resistant enclosure of the type including a door frame defining a doorway, a door pivotally supported on said door frame and sized to close said doorway, each said door and door frame having conductive edge portions and both having doorway and door contact plate portions cooperating to offer and receive a conductive blade when the door is closed, completing a conductive path between the door and doorway portions and said blade, characterized in that doorway portion includes a channel having a pair of stepped side walls and an end wall whereby to define an elongated chamber interiorly of the channel the end wall, each side wall including a first, second and third portion, the third portions facing the end wall and joining the first and second portions whereby to define a shoulder, and said contact means comprise a pair of contact members that extend the length of the channel for electrically interconnecting with each portion of the side walls, the opposite sides of said blade when the blade is inserted therein, each contact member having a pair of bowed sections, respectively, engaging the first portion and a second portion of one said side wall.

14. The doorway construction as recited in claim 13 wherein said side walls incline towards one another at an acute angle to a perpendicular to the end wall.

* * * * *